US011158563B2

(12) United States Patent
Gohara et al.

(10) Patent No.: US 11,158,563 B2
(45) Date of Patent: Oct. 26, 2021

(54) POWER SEMICONDUCTOR MODULE AND VEHICLE

(71) Applicant: FUJI ELECTRIC CO., LTD., Kanagawa (JP)

(72) Inventors: Hiromichi Gohara, Matsumoto (JP); Takafumi Yamada, Matsumoto (JP); Yuta Tamai, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 73 days.

(21) Appl. No.: 16/525,581

(22) Filed: Jul. 30, 2019

(65) Prior Publication Data

US 2020/0051892 A1 Feb. 13, 2020

(30) Foreign Application Priority Data

Aug. 13, 2018 (JP) .............................. JP2018-152330

(51) Int. Cl.
*H01L 23/34* (2006.01)
*H01L 23/40* (2006.01)
(Continued)

(52) U.S. Cl.
CPC ........ *H01L 23/4006* (2013.01); *B60R 16/033* (2013.01); *B60R 16/08* (2013.01);
(Continued)

(58) Field of Classification Search
CPC ............... H01L 23/4006; H01L 23/473; H01L 2023/4031; H01L 2023/405;
(Continued)

(56) References Cited

U.S. PATENT DOCUMENTS

| 6,441,317 | B1 | 8/2002 | Tanaka |
| 2013/0264702 | A1 | 10/2013 | Nishi |

(Continued)

FOREIGN PATENT DOCUMENTS

| JP | H07176642 A | 7/1995 |
| JP | 2001135788 A | 5/2001 |

(Continued)

OTHER PUBLICATIONS

Office Action issued for counterpart Japanese Application No. 2018-152330, issued by the Japan Patent Office dated Sep. 11, 2018 (drafted on Sep. 3, 2018).
Office Action issued for counterpart German Application 102019120130.6, issued by the German Patent and Trademark Office dated May 27, 2020.

*Primary Examiner* — Meiya Li

(57) ABSTRACT

A power semiconductor module including a cooling apparatus and a power semiconductor device mounted on the cooling apparatus, wherein the cooling apparatus includes: a ceiling plate that; a case; and a cooling fin, a ceiling plate and the case respectively include fastening portions that are used to fasten the ceiling plate and the case to an external apparatus, while the ceiling plate and the outer edge portion are arranged in an overlapping manner, the power semiconductor device includes a circuit substrate and a terminal case, the fastening portions protrude farther outward than a periphery of the ceiling plate, and the terminal case includes a case body arranged along a perimeter of the circuit substrate and reinforcing portions that extend to top surface sides of the fastening portions.

14 Claims, 13 Drawing Sheets

(51) Int. Cl.
  *H01L 23/473* (2006.01)
  *H01L 23/043* (2006.01)
  *H01L 25/07* (2006.01)
  *H02K 11/33* (2016.01)
  *B60R 16/033* (2006.01)
  *B60R 16/08* (2006.01)
  *H02K 7/00* (2006.01)

(52) U.S. Cl.
  CPC ......... *H01L 23/043* (2013.01); *H01L 23/473* (2013.01); *H01L 25/072* (2013.01); *H02K 7/006* (2013.01); *H02K 11/33* (2016.01); *H01L 2023/405* (2013.01); *H01L 2023/4031* (2013.01); *H01L 2023/4087* (2013.01)

(58) Field of Classification Search
  CPC ........... H01L 2023/4087; H01L 23/043; H01L 23/053; H01L 23/24; H01L 23/3735; H01L 23/562; H01L 25/072; H01L 23/13; H01L 23/3672; H01L 23/40; H01L 25/18
  See application file for complete search history.

(56) References Cited

U.S. PATENT DOCUMENTS

2014/0376184 A1* 12/2014 Gohara ................. H01L 23/473
                                                                  361/689
2016/0079744 A1    3/2016 Nagasawa
2017/0006721 A1    1/2017 Soyano

FOREIGN PATENT DOCUMENTS

| | | |
|---|---|---|
| JP | 2003168769 A | 6/2003 |
| JP | 2006324647 A | 11/2006 |
| JP | 2011243793 A | 12/2011 |
| JP | 2014179563 A | 9/2014 |
| JP | 2015065310 A | 4/2015 |
| JP | 2015220382 A | 12/2015 |
| JP | 2016059201 A | 4/2016 |
| JP | 2017017195 A | 1/2017 |
| JP | 2017183421 A | 10/2017 |
| WO | 2013157467 A1 | 10/2013 |
| WO | 2016204257 A1 | 12/2016 |

* cited by examiner

POWER SEMICONDUCTOR MODULE AND VEHICLE

The contents of the following Japanese patent application are incorporated herein by reference:
2018-152330 filed on Aug. 13, 2018.

BACKGROUND

1. Technical Field

The present invention relates to a power semiconductor module and a vehicle.

2. Related Art

A conventional semiconductor module is known that includes a semiconductor element such as a power semiconductor chip and is provided with a cooling apparatus, as shown in Patent Documents 1 to 5, for example.
Patent Document 1: Japanese Patent Application Publication No. 2017-17195
Patent Document 2: Japanese Patent Application Publication No. 2014-179563
Patent Document 3: Japanese Patent Application Publication No. H7-176642
Patent Document 4: WO 2013/157467
Patent Document 5: Japanese Patent Application Publication No. 2017-183421

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
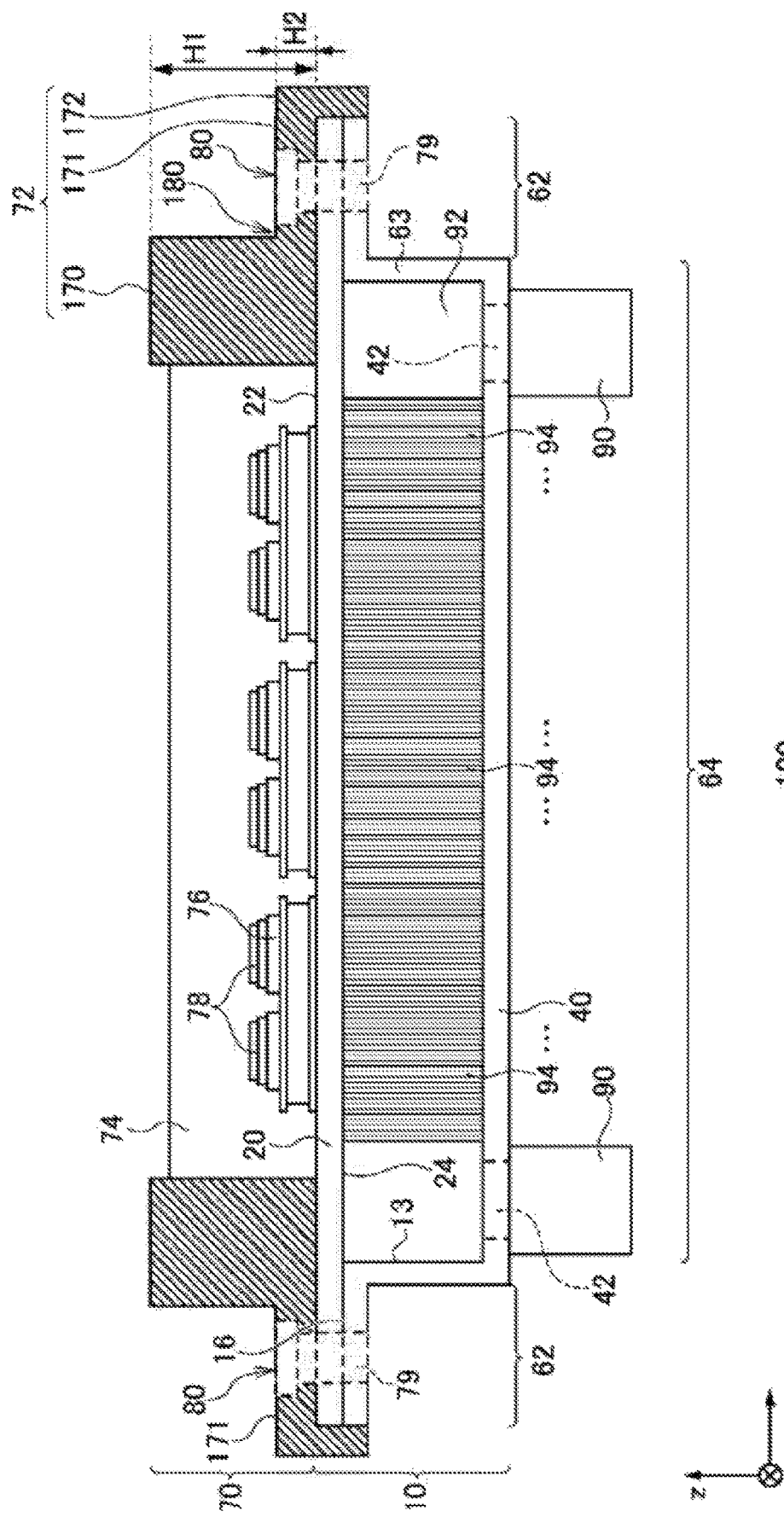
FIG. 1 is a schematic cross-sectional view of an example of a power semiconductor module 100 according to one embodiment of the present embodiment.

FIG. 1 is a schematic cross-sectional view of an example of a power semiconductor module 100 according to one embodiment of the present invention. The power semiconductor module 100 includes a power semiconductor device 70 and a cooling apparatus 10. The power semiconductor device 70 of the present embodiment is mounted on the cooling apparatus 10. In this specification, the plane of the cooling apparatus 10 on which the power semiconductor device 70 is mounted is the xy-plane, and the plane perpendicular to the xy-plane is along the z-axis. In this specification, a direction from the cooling apparatus 10 toward the power semiconductor device 70 in the z-axis direction is up and the opposite of this direction is down, but the up and down directions are not limited to the direction of gravity. Furthermore, in this specification, for the surfaces of each component, the surface on the top side is referred to as the top surface, the surface on the bottom side is referred to as the bottom surface, and surfaces between the top surface and the bottom surface are referred to as side surfaces.

The power semiconductor device 70 includes one or more semiconductor chips 78, such as power semiconductors. As an example, the semiconductor chip 78 has a switching element provided on a semiconductor substrate made of silicon, silicon carbide, or the like. The switching element is an insulated gate bipolar transistor (IGBT) or a MOSFET, for example.

The power semiconductor device 70 includes a circuit substrate 76 and a terminal case 72. The circuit substrate 76 is an insulated substrate that has a top surface and a bottom surface, is provided with a circuit pattern on the top surface, and is provided with a metal layer on the bottom surface, for example. The circuit pattern may be formed by a metal layer. The semiconductor chip 78 is secured to the circuit substrate 76 via solder or the like. The terminal case 72 is formed of an insulating material such as resin. The terminal case 72 has an internal space in which the semiconductor chip 78, the circuit substrate 76, wires, and the like are housed. The internal space of the terminal case 72 is filled with a sealing portion 74 that seals in the semiconductor chip 78, the circuit substrate 76, the wires, and the like. The sealing portion 74 is an insulating material such as silicone gel or epoxy resin, for example.

The terminal case 72 includes a case body 170, a plurality of reinforcing portions 171, and a side surface portion 172. The case body 170 is arranged along the perimeter of the circuit substrate 76. At least one of the plurality of reinforcing portions 171 extends outward from the case body 170 and the connecting portion 180. The details of each of the plurality of reinforcing portions 171 are described further below. The reinforcing portions 171, the side surface portion 172, and the case body 170 are formed integrally by an insulating material such as resin, e.g. polyphenylene sulfide (PPS). Instead of PPS, the resin used for the terminal case 72 can be selected from among an insulating resin such as polybutylene terephthalate (PBT), polybutyl acrylate (PBA), polyamide (PA), acrylonitrile butadiene styrene (ABS), liquid crystal polymer (LCP), polyether ether ketone (PEEK), polybutylene succinate (PBS), urethane, and silicon. The resin may be a mixture of two or more types of resin. The resin may include a filler (e.g. a glass filler) in order to strengthen and/or improve the functionality thereof.

The cooling apparatus 10 includes a ceiling plate 20 and a case 40. The ceiling plate 20 may be a board-shaped metal plate that has a top surface 22 and a bottom surface 24 that are parallel to the xy-plane. As an example, the ceiling plate 20 is formed of metal including aluminum. The power semiconductor device 70 is mounted on the top surface 22 of the ceiling plate 20. Heat generated by the semiconductor chip 78 is transferred to the ceiling plate 20, mainly via the circuit substrate 76. For example, the thermally conductive components such as the circuit substrate 76 and solder are arranged between the ceiling plate 20 and the semiconductor chip 78. The circuit substrate 76 may be directly secured to the top surface 22 of the ceiling plate 20 by solder or the like. In this case, the terminal case 72 is provided surrounding the region where the circuit substrate 76 is arranged on the top surface 22 of the ceiling plate 20. As another example, the power semiconductor device 70 may include a metal plate that is exposed in the bottom surface of the terminal case 72, the circuit substrate 76 may be secured to the top surface of this metal plate, and this metal plate may be secured to the top surface 22 of the ceiling plate 20.

The case 40 is arranged such that a cavity 92 is formed between the ceiling plate 20 and the bottom surface 24. The cavity 92 functions as a coolant flow-through portion through which a coolant such as water flows. Furthermore, the case 40 is arranged to be in firm contact, either directly or indirectly, with the bottom surface 24 of the ceiling plate 20 on the top surface 16 of a frame 62 functioning as an outer edge portion that surrounds the cavity 92 in the xy-plane. In this way, the cavity 92 is closed off. Here, "indirect firm contact" refers to a state in which the bottom surface 24 of the ceiling plate 20 and the case 40 are in firm contact via a brazing material, sealing material, adhesive, or another member provided between the bottom surface 24 of the ceiling plate 20 and the case 40. Furthermore, "firm contact" refers to a state in which the coolant inside the cavity 92 does not leak out from the portions in firm contact. A cooling fin 94 is arranged inside the cavity 92. The cooling fin 94 may be connected to the bottom surface 24 of the ceiling plate 20. The heat generated by the semiconductor chip 78 is passed on to the coolant, by causing the coolant to flow near the cooling fin 94. In this way, it is possible to cool the power semiconductor device 70. The case 40 of the present example includes the frame 62, a floor plate 64, and a sidewall 63.

The frame 62 is arranged surrounding the cavity 92 in the xy-plane. The top surface 16 of the frame 62 is arranged in firm contact, either directly or indirectly, with the bottom surface 24 of the ceiling plate 20. In other words, the top surface 16 of the frame 62 and the bottom surface 24 of the ceiling plate 20 are provided in a manner to close off the cavity 92. A sealing material or another member may be provided between the top surface 16 of the frame 62 and the bottom surface 24 of the ceiling plate 20.

In the present example, brazing material is provided between the ceiling plate 20 and the case 40. As an example, the ceiling plate 20 and the case 40 are formed of metals having the same composition, and the brazing material is formed of metal with a lower melting point than the ceiling plate 20 and the like. Metal including aluminum may be used as this metal. An aluminum alloy such as an Al—Mn alloy (3000 series aluminum alloy) or Al—Mg—Si alloy (6000 series aluminum alloy) may be used as this metal including aluminum. An aluminum alloy such as an Al—Si alloy (4000 series aluminum alloy) may be used as the brazing material. The aluminum alloy used in the present example is preferably an alloy whose endurance at room temperature is in a range from 35 MPa to 65 MPa. The endurance refers to the stress at which a permanent strain of 0.2% is caused when unloaded.

The floor plate 64 is arranged in a manner to form the cavity 92 between the ceiling plate 20 and the bottom surface 24. The floor plate 64 of the present example is provided with two or more openings 42, for guiding the coolant into and out from the cavity 92. Pipes 90 that transport the coolant are connected to the openings 42. The pipes 90 protrude away from the cooling fin 94 (in the −z-axis direction in the present example), with the floor plate 64 as a reference. The pipes 90 may be pipe joints (nipples) for connecting the cooling apparatus 10 to an external cooling system.

The sidewall 63 defines the cavity 92 by connecting the frame 62 and the floor plate 64. The sidewall 63 of the present embodiment connects the peripheral edge of the floor plate 64 to the inner surface 13 of the frame 62. The inner surface 13 of the frame 62 is a side wall that faces the cavity 92. The peripheral edge of the floor plate 64 is a peripheral portion of the floor plate 64 in the xy-plane.

The ceiling plate 20 and the case 40 include fastening portions 80 that fasten these components to each other. The fastening portions 80 fasten the reinforcing portion 171 together with the ceiling plate 20, the case 40, and the power semiconductor device 70. The fastening portions 80 and the reinforcing portion 171 may be used to secure the power semiconductor module 100 to an external apparatus.

As an example, the fastening portions 80 are regions where the ceiling plate 20 and the case 40 are formed in firm contact, either directly or indirectly, and stacked in the z-axis direction, and also regions where a through-hole 79 passing through the ceiling plate 20 and the case 40 is formed. In FIG. 1, the regions where through-holes 79 are formed in the ceiling plate 20 and the case 40 are shown by dashed lines. The fastening portions 80 of the present example are provided to the frame 62.

Figure 2A:
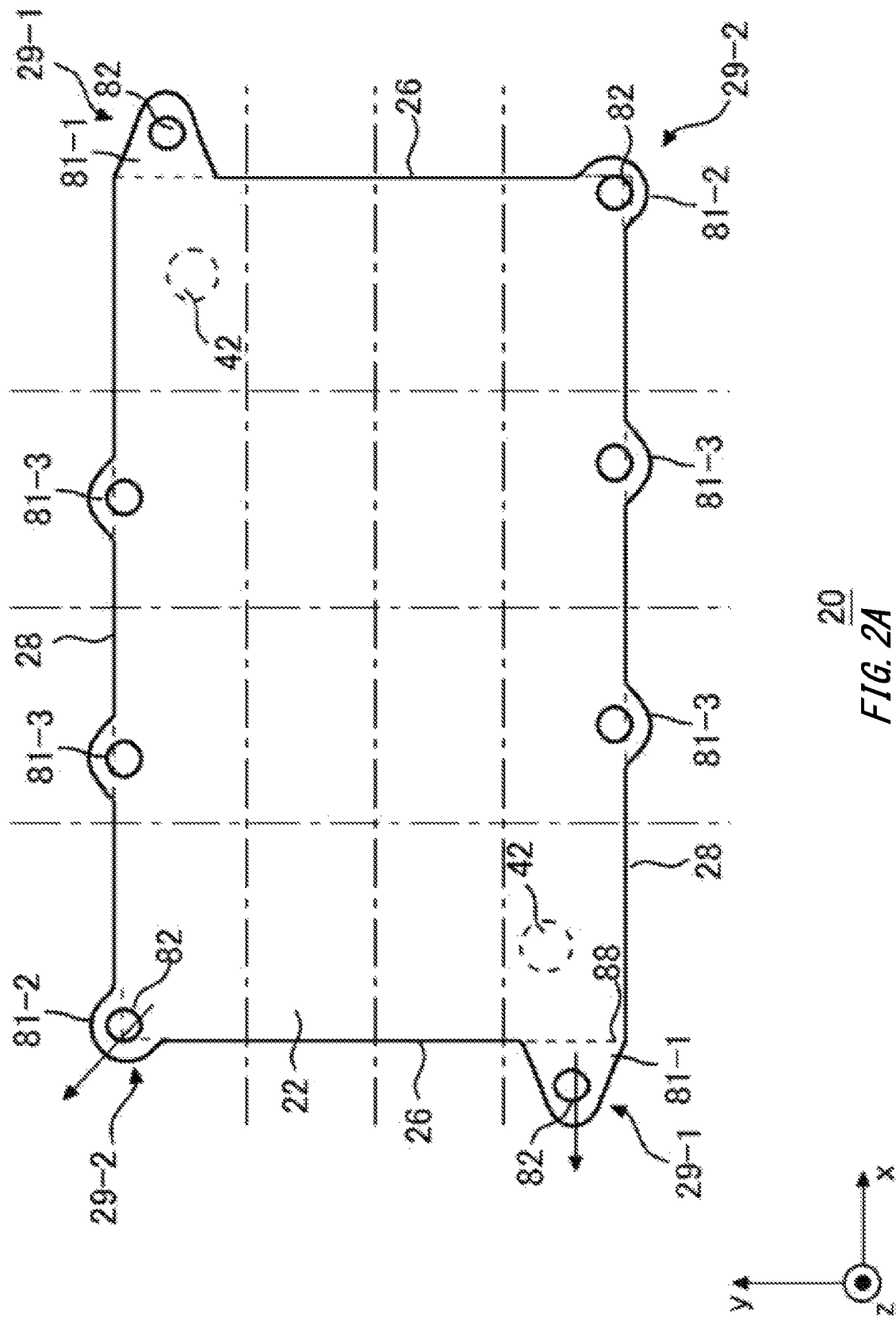
FIG. 2A shows an example of the shape of the ceiling plate 20 in an overhead view (xy-plane).

FIG. 2A shows an example of the shape of the ceiling plate 20 in an overhead view (xy-plane). The ceiling plate 20 includes two sets of opposing edges 26 and 28 in the overhead view. The ceiling plate 20 of the present example has a substantially rectangular shape, with short edges 26 and long edges 28. The ceiling plate 20 has four corner portions 29. In this specification, the direction in which the short edges 26 extend is the y-axis, and the direction in which the long edges 28 extend is the x-axis.

The rectangular periphery 88 defined by the long edges 28 and the short edges 26 is the periphery of the ceiling plate 20. In other words, the shape of the periphery 88 is a shape obtained by replacing the uneven portions of the long edges 28 and short edges 26 of the ceiling plate 20 with straight lines along the long edges 28 and short edges 26. In FIG. 2A, the periphery 88 is shown by dashed lines.

The corner portions 29 refer to regions near the respective peaks of the periphery 88 of the ceiling plate 20. As an example, as shown by the single-dot chain lines in FIG. 2A, the four regions arranged at the corners of the periphery 88, among the 16 regions obtained by dividing the periphery 88 of the ceiling plate 20 into four equal sections in each of the x-axis direction and y-axis direction, are the corner portions 29. In the present example, the corner portions 29 arranged opposite the openings 42 of the case 40 are first corner portions 29-1, and the other corner portions 29 are second corner portions 29-2. The first corner portions 29-1 may include all or a portion of the regions opposite the openings 42. In FIG. 2A, the regions opposite the openings 42 are shown by dashed lines.

The ceiling plate 20 is provided with one or more fastening portions 81 that are part of the fastening portions 80 shown in FIG. 1. At least one fastening portion 81 may be provided at a corner portion 29. In the present example, fastening portions 81 are provided at all of the corner portions 29. Furthermore, each long edge 28 may also be provided with a fastening portion 81, but does not need to be provided with a fastening portion 81. Each short edge 26 may be provided with a fastening portion 81, but does not need to be provided with a fastening portion 81.

Each fastening portion 81 is provided protruding outward from the periphery 88 of the ceiling plate 20. In the present example, "outward" refers to a direction away from the center of the ceiling plate 20 in the xy-plane. Each fastening portion 81 includes a through-hole 82 that is part of the through-holes 79 shown in FIG. 1. Each through-hole 82 may be arranged outward from the periphery 88, inward from the periphery 88, or overlapping with the periphery 88.

In the present example, all of the through-holes 82 are arranged outward from the periphery 88 at a respective first fastening portion 81-1 at a first corner portion 29-1. Furthermore, through-holes 79 may be arranged inward from the periphery 88 or overlapping with the periphery 88 at the second fastening portions 81-2 of the second corner portions 29-2 and the third fastening portions 81-3 at the edges. The pipes 90 are connected to the openings 42. By arranging the through-holes 82 of the first fastening portions 81-1 outward from the periphery 88, the work involved in connecting the pipes 90, the work involved in fastening screws or the like in the through-holes 82 of the first fastening portions 81-1, and the like can be made easier.

The length that each first fastening portion 81-1 extends outward from the periphery 88 is preferably greater than the length that the other fastening portions 81 extend outward from the periphery 88. In this way, it is possible to arrange the through-holes 82 of the first fastening portions 81-1 away from the openings 42. Furthermore, as described in FIG. 1, the fastening portions 81 are provided overlapping with the reinforcing portions 171, and therefore the strength of each first fastening portion 81-1 can be maintained even when the protrusion length thereof is long.

Each first fastening portion 81-1 may be provided protruding from the periphery 88 in a direction parallel to the long edges 28 (i.e. the x-axis direction) in the xy-plane. This parallel direction may include a prescribed error. For example, there may be an inclination of 20 degrees or less between the direction of the long edges 28 and the protrusion directions of the first fastening portions 81-1. The protrusion direction of each fastening portion 81 may be a direction connecting the peak of the fastening portion 81 (the point farthest from the periphery 88) and the periphery 88 via the shortest distance. In FIG. 2A, the protrusion directions of some of the fastening portions 81 are shown by arrows. In this way, even when the protrusion lengths of the first fastening portions 81-1 are long, it is possible to prevent the ceiling plate 20 from becoming long in the y-axis direction.

The second fastening portions 81-2 may be provided protruding in different directions than the first fastening portions 81-1. In the example of FIG. 2A, the second fastening portions 81-2 protrude in directions forming 45 degree angles with respect to the y-axis. Since each second fastening portion 81-2 has a relatively short protrusion length, the ceiling plate 20 does not become significantly larger even though these second fastening portions 81-2 protrude in these directions. Furthermore, the third fastening portions 81-3 protrude in the y-axis direction from the periphery 88. The length that the second fastening portions 81-2 protrude in the y-axis direction from the periphery 88 may be the same as the length that the third fastening portions 81-3 protrude in the y-axis direction from the periphery 88. In FIG. 2A, two first fastening portions 81-1 may be arranged symmetrically with respect to the center of the ceiling plate 20 in the xy-plane. Similarly, two second fastening portions 81-2 may be arranged symmetrically with respect to the center of the ceiling plate 20 in the xy-plane.

Figure 2B:
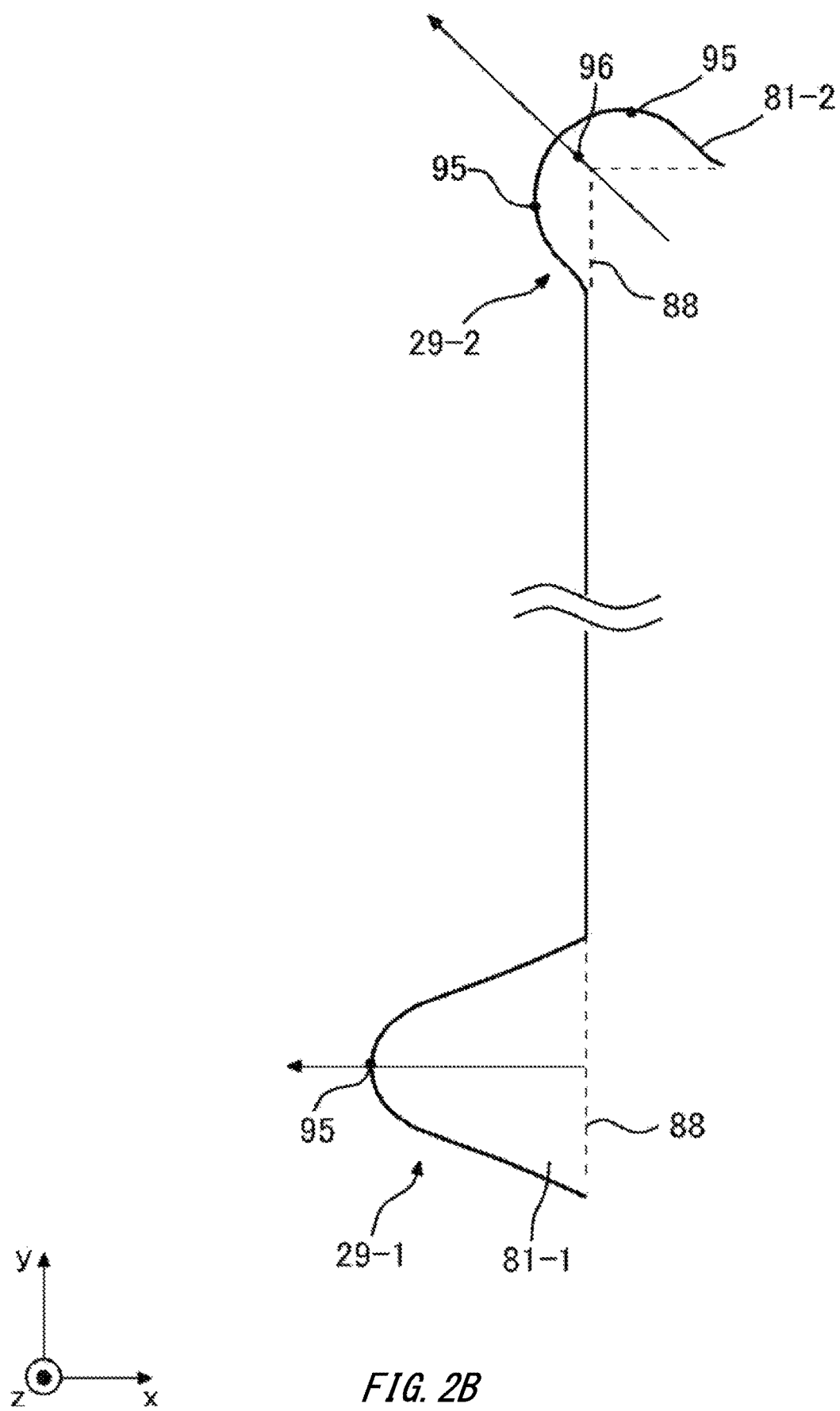
FIG. 2B is a diagram for describing protrusion directions of the fastening portion 81.

FIG. 2B is a diagram for describing protrusion directions of the fastening portions 81. FIG. 2B is an enlarged view of a region near a fastening portion 81-1 and a fastening portion 81-2. In FIG. 2B, the through-holes 82 of the fastening portions 81 are omitted. In the present example, for each fastening portion 81, the point farthest from the periphery 88 in the xy-plane is a peak 95. As described above, the protrusion direction of each fastening portion 81 is a direction connecting the peak 95 with the periphery 88 via the shortest distance. However, as shown by the fastening portion 81-2, in a case where there are a plurality of peaks 95, the protrusion direction of the fastening portion 81 may be a direction connecting the periphery 88 and a position 96 that is the average of the plurality of peaks 95 in an xy-coordinate space via the shortest distance. The position 96 that is the average of the plurality of peaks 95 is a position indicating the average of the coordinate values of the plurality of peaks 95 for each of the x-coordinate and the y-coordinate.

Figure 3:
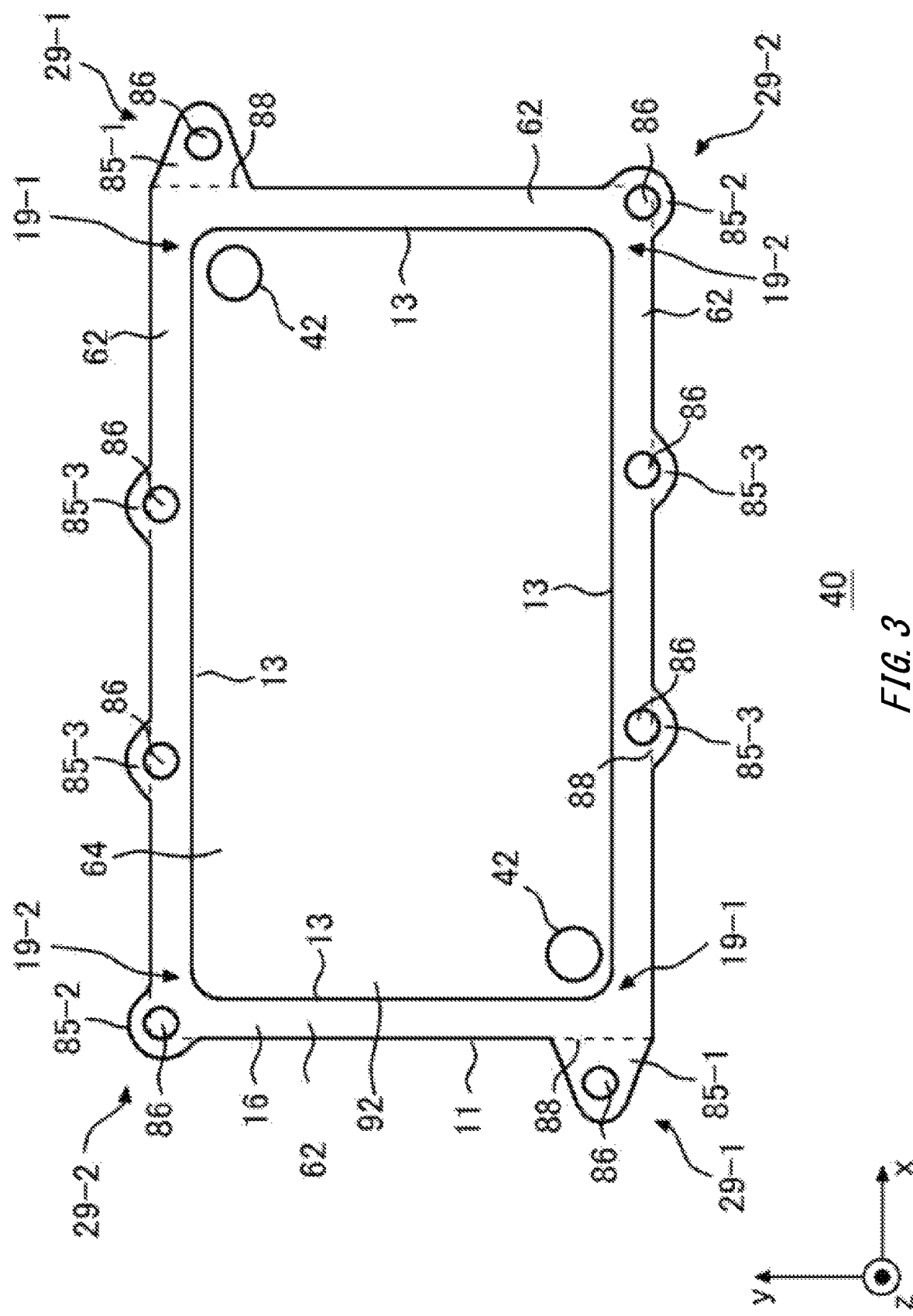
FIG. 3 shows an example of the shape of the case 40 in an overhead view (xy-plane).

FIG. 3 shows an example of the shape of the case 40 in an overhead view (xy-plane). The outer shape of the case 40 of the present example in the xy-plane is the same as the outer shape of the ceiling plate 20. In the present example, the outer shape of the frame 62 corresponds to the outer shape of the case 40. The frame 62 includes an inner surface 13 on the cavity 92 side and an outer surface 11 on a side opposite the inner surface 13. Each side surface in the present example is substantially perpendicular to the xy-plane. In FIG. 3, the periphery 88 of the ceiling plate 20 is shown overlapping the shape of the case 40. Furthermore, in the same manner as the ceiling plate 20, the case 40 also has corner portions 29 in the xy-plane.

Each corner portion 29 of the case 40 is provided with a fastening portion 85, which is one of the fastening portions 80, in the same manner as the ceiling plate 20. Furthermore, fastening portions 85 may be provided at each edge of the case 40. Each fastening portion 85 is provided protruding outward from the frame 62, beyond the periphery 88. Here, "outward" refers to a direction away from the center of the cavity 92 in the xy-plane.

In the present example, the shape of each fastening portion 85 in the xy-plane is the same as the shape of the opposing fastening portion 81. Each fastening portion 85 is provided with a through-hole 86. Each through-hole 86 is provided at a position overlapping with a through-hole 82 shown in FIG. 2A.

The floor plate 64 is provided inside the frame 62 in the xy-plane. The floor plate 64 has four corner portions 19. The corner portions 19 may be the four regions arranged at the corners, among the 16 regions obtained by dividing the periphery of the floor plate 64 into four equal sections in each of the x-axis direction and y-axis direction, in the same manner as the corner portions 29. The fastening portions 85 are provided in the periphery 88 of the ceiling plate 20, protruding outward away from the corner portions 19 of the floor plate 64 and the openings 42.

An opening 42 that connects the cavity 92 to the outside is provided to some of the corner portions 19 of the floor plate 64. The floor plate 64 of the present example has an opening 42 provided to each of two corner portions 19 arranged symmetrically with respect to the center of the floor plate 64 in the xy-plane. As shown in FIGS. 2A and 3, the corner portions 29-1 of the ceiling plate 20 provided with the fastening portions 81-1 and the corner portions 19-1 of the floor plate 64 provided with the openings 42 are arranged at positions opposite each other.

In the present example, the respective corner portions 19 are identified using the relative positions on the x-axis and y-axis, such that there is a corner portion 19 on the positive x-axis side and positive y-axis side (a corner portion 19-1 in the example of FIG. 3), a corner portion 19 on the positive x-axis side and negative y-axis side (a corner portion 19-2 in the example of FIG. 3), a corner portion 19 on the negative x-axis side and positive y-axis side (a corner portion 19-2 in the example of FIG. 3), and a corner portion 19 on the negative x-axis side and negative y-axis side (a corner portion 19-1 in the example of FIG. 3). Similarly, the respective corner portions 29 are identified using the relative positions on the x-axis and y-axis, such that there is a corner portion 29 on the positive x-axis side and positive y-axis side (a corner portion 29-1 in the example of FIG. 2A), a corner portion 29 on the positive x-axis side and negative y-axis side (a corner portion 29-2 in the example of FIG. 2A), a corner portion 29 on the negative x-axis side and positive y-axis side (a corner portion 29-2 in the example of FIG. 2A), and a corner portion 29 on the negative x-axis side and negative y-axis side (a corner portion 29-1 in the example of FIG. 2A). Two corner portions that are opposite each other in the floor plate 64 and the ceiling plate 20 refer to a corner portion 19 and a corner portion 29 that have corresponding relative positions on the x-axis and y-axis. More specifically, the corner portion 19 on the positive x-axis side and positive y-axis side and the corner portion 29 on the positive x-axis side and positive y-axis side are opposite each other, the corner portion 19 on the positive x-axis side and negative y-axis side and the corner portion 29 on the positive x-axis side and negative y-axis side are opposite each other, the corner portion 19 on the negative x-axis side and positive y-axis side and the corner portion 29 on the negative x-axis side and positive y-axis side are opposite each other, and the corner portion 19 on the negative x-axis side and negative y-axis side and the corner portion 29 on the negative x-axis side and negative y-axis side are opposite each other.

Figure 4:
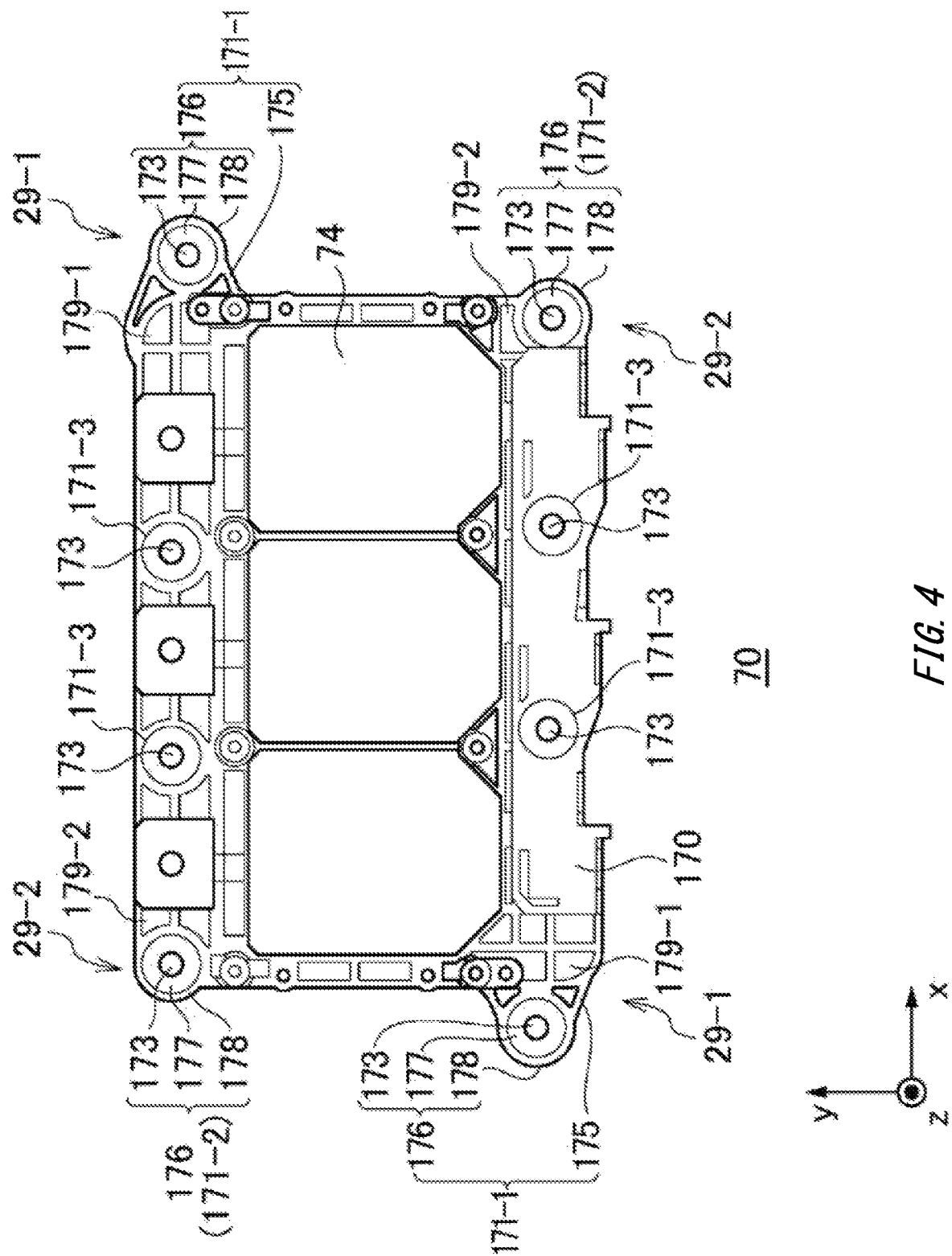
FIG. 4 shows an example of the shape of the power semiconductor device 70 in an overhead view (xy-plane).
Figure 5:
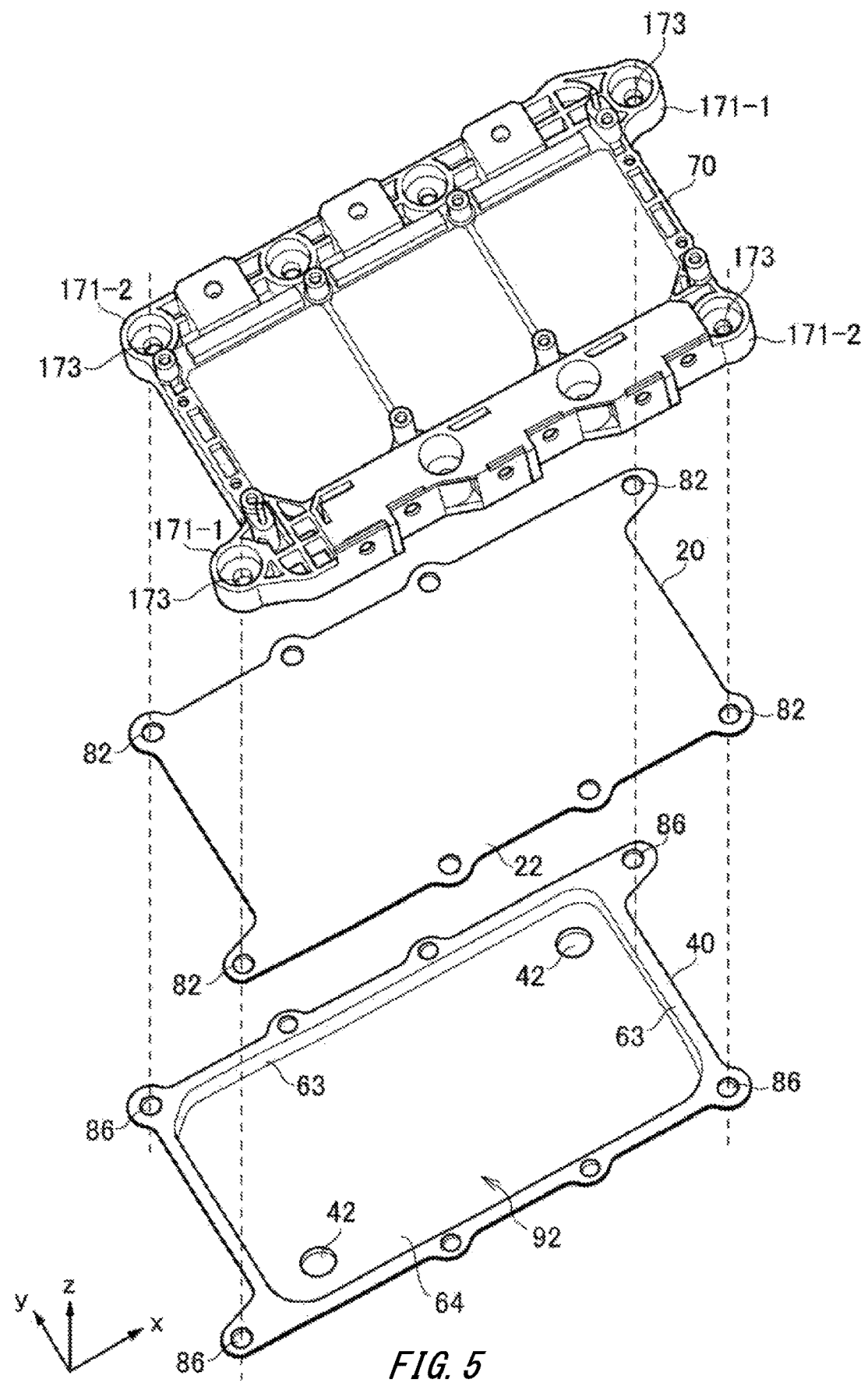
FIG. 5 is an exploded perspective view of the power semiconductor module 100.

FIG. 4 shows an example of the shape of the power semiconductor device 70 in an overhead view (xy-plane), and FIG. 5 is an exploded perspective view of the power semiconductor module 100. In order to simplify the description relating to FIG. 5, a state is shown in which the power semiconductor device 70, the ceiling plate 20, and the case 40 are separated from each other, and components such as the cooling fin 94 are omitted from the drawing.

The case body 170 of the power semiconductor device 70 of the present example has four corner portions 179 corresponding to the four corner portions 29 of the ceiling plate 20, and forms a substantially rectangular frame in the xy-plane. Therefore, the periphery of the case body 170 can also be said to be substantially rectangular. Each corner portion 179 of the case body 170 is provided with a reinforcing portion 171-1 or 171-2 that extends outward from this corner portion 179. Specifically, these reinforcing portions 171-1 and 171-2 protrude father outward than the periphery of the case body 170. Here, "outward" refers to a direction away from the center of the power semiconductor device 70 in the xy-plane.

More specifically, all of the reinforcing portions 171-1 of the corner portions 179-1 that are opposite the corner portions 29-1 protrude further outward than the periphery of the case body 170. On the other hand, some of the reinforcing portions 171-2 of the corner portions 179-2 that are opposite the corner portions 29-2 protrude farther outward than the periphery of the case body 170, while the others are arranged to be farther inward than the periphery of the case body 170. Furthermore, the pair of long edge portions of the rectangular case body 170 are each provided with two reinforcing portions 171-3 arranged within the case body 170.

The through-holes 173 penetrating through the reinforcing portions 171-1 overlap with the through-holes 82 of the fastening portions 81-1 of the ceiling plate 20, in the overhead view. Similarly, the through-holes 173 penetrating through the reinforcing portions 171-2 overlap with the through-holes 82 of the fastening portions 81-2 of the ceiling plate 20 in the overhead view, and the through-holes 173 penetrating through the reinforcing portions 171-3 overlap with the through-holes 82 of the fastening portions 81-3 of the ceiling plate 20 in the overhead view.

The outer shape of the power semiconductor device 70 of the present embodiment in the xy-plane is similar to the outer shape of the ceiling plate 20, but is slightly larger. More specifically, the periphery of the case body 170 of the power semiconductor device 70 in the xy-plane has a similar shape as the periphery 88 of the ceiling plate 20, but is slightly larger. Furthermore, each reinforcing portion 171 of the power semiconductor device 70 in the present example is arranged opposite a fastening portion 81 of the ceiling plate 20 in the power semiconductor module 100. Each reinforcing portion 171 and corresponding fastening portion 81 overlap in the overhead view, and each reinforcing portion 171 contacts the entire top surface of the corresponding fastening portion 81 to cover this top surface. In other words, the fastening portions 81 of the ceiling plate 20 are not exposed in the overhead view. Reinforcing portions 171 and fastening portions 81 that are opposite each other may be secured together by an adhesive.

In other words, the two reinforcing portions 171-1 of the power semiconductor device 70 extend to the top surface side of the two fastening portions 81-1 of the ceiling plate 20. Similarly, the two reinforcing portions 171-2 of the power semiconductor device 70 extend to the top surface side of the two fastening portions 81-2 of the ceiling plate 20, and the four reinforcing portions 171-3 of the power semiconductor device 70 extend to the top surface side of the four fastening portions 81-3 of the ceiling plate 20. Furthermore, in accordance with the fastening portions 81-1 of the ceiling plate 20 extending farther outward than the fastening portions 81-2, the reinforcing portions 171-1 extend farther outward from the case body 170 than the reinforcing portions 171-2.

As described above, the fastening portions 80, including the fastening portions 81 of the ceiling plate 20 and the fastening portions 85 of the case 40, are provided protruding farther outward than the sidewall 63 of the case 40. Furthermore, among the fastening portions 81, the fastening portions 81-1 and 81-2 are provided protruding farther outward than the case body 170, in the overhead view. In other words, the tips of the fastening portions 81-1 and 81-2 in the xy-plane have cantilever structures not supported by other members of the power semiconductor module 100. Therefore, the fastening portions 81-1 and 81-2 deform relatively easily, but it is possible to improve the strength of the fastening portions 80 by providing the reinforcing portions 171-1 and 171-2.

On the other hand, among the fastening portions 81, all of the fastening portions 81-3 are positioned farther inward than the case body 170, in the overhead view. Accordingly, the reinforcing portions 171-3 that are opposite the fastening portions 81-3 do not protrude farther outward than the case body 170. It can be said that the case body 170 itself extends to the top surface side of the fastening portions 81-3, to reinforce the fastening portions 81-3.

As described above, by providing the reinforcing portions 171 on the top surfaces of the fastening portions 80, it is possible to improve the strength of the fastening portions 80 in which stress is prone to focus. Furthermore, by providing the reinforcing portions 171, it is possible to improve the strength of the fastening portions 80 without increasing the thicknesses of the sidewall 63 and the floor plate 64. Since the thicknesses of the sidewall 63 and the floor plate 64 are not increased, the sidewall 63 and the floor plate 64 can deform relatively easily in response to stress. Therefore, even if the coolant within the cavity 92 expands or contracts due to a temperature change of the cooling fin 94 or the like, for example, it is easy to absorb this change in volume by having the sidewall 63 and the floor plate 64 deform. Furthermore, in a case where the power semiconductor module 100 is connected to an external apparatus by the pipes 90 and fastening members, even if force is applied to the case 40 for the connection and then a further force is applied due to vibration, these forces are absorbed by the sidewall 63 and the floor plate 64, and cantilever structure of the fastening portions 80 is supported by the reinforcing portions 171. Therefore, it is possible to protect the fastening portions 80.

Figure 6:
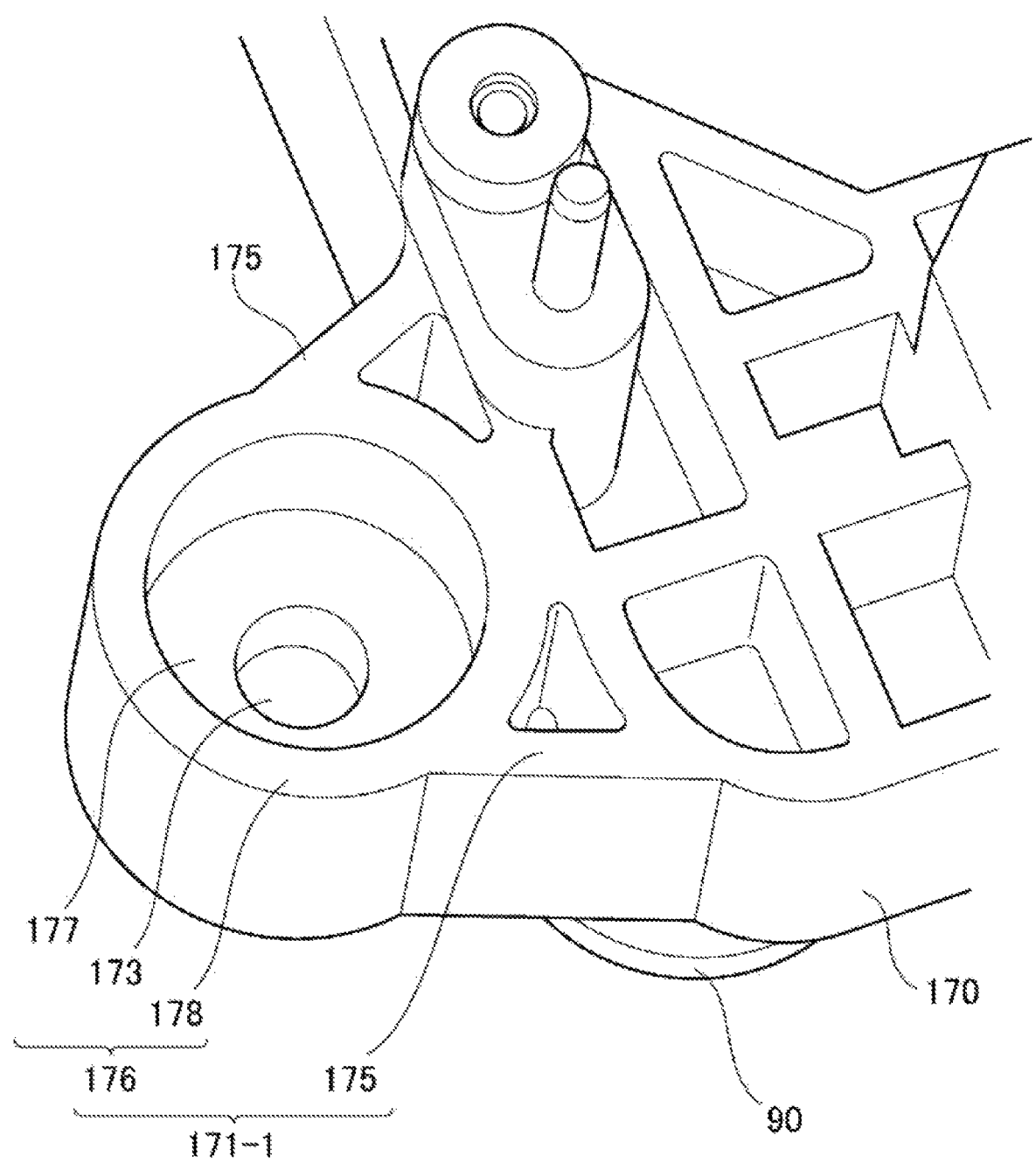
FIG. 6 is a partial enlarged perspective view of an example of a reinforcing portion 171-1.

FIG. 6 is a partial enlarged perspective view of an example of a reinforcing portion 171-1. The reinforcing portion 171-1 of the present example is formed by a combination of a pair of triangular pillar portions 175 that extend outward beyond the case body 170 and one cylindrical portion 176 that extends farther outward beyond the triangular pillar portions 175. The pair of triangular pillar portions 175 are arranged on the case body 170 side, with the peaks thereof oriented toward each other in the overhead view. Each triangular pillar portion 175 may be hollow and include a floor surface. Instead, each triangular pillar portion 175 may be solid. The triangular pillar portions 175 and the cylindrical portion 176 may each be arranged such that the side surface thereof is parallel to the z-axis. Instead of the triangular pillar portions 175, other pillar-shaped bodies such as polygonal pillars or circular pillars may be combined with the cylindrical portion 176.

The cylindrical portion 176 includes a flat surface portion 177 arranged around the through-hole 173 described above and a cylindrical portion 178 that surrounds this flat surface portion 177. The cylindrical portion 178 is thicker than the flat surface portion 177 in the up-down direction. Furthermore, as shown in the cross section of FIG. 1, the thickness of the cylindrical portion 178, i.e. the height H2, excluding the side surface portion 172 in the up-down direction is less than or equal to the total height H1 of the case body 170 excluding the side surface portion 172. It can be said that this cylindrical portion 176 is also hollow and includes a partial floor surface. Furthermore, the entire case body 170, i.e. the portion of the terminal case 72 excluding the reinforcing portions 171, may have a uniform height of H1, thereby increasing the strength of the case body 170. The through-hole 173 and the cylindrical portion 178 may be arranged to be coaxial.

The triangular pillar portions 175 and the cylindrical portion 176 are lightweight and easily formed, and therefore it is possible to increase the strength of the reinforcing portions 171 themselves, thereby improving the strength of the fastening portion 80. Furthermore, by making the flat surface portion 177 shorter than the cylindrical portion 178, the head of the screw used for fastening is housed within the cylindrical portion 178, and therefore the fastening portion can be made smaller.

FIRST EMBODIMENT EXAMPLE

A portion of the power semiconductor module 100 shown in FIGS. 1 to 6 including a reinforcing portion 171-1 and a fastening portion 80-1 is provided as a first embodiment example. In the first embodiment example, the reinforcing portion 171-1 and the fastening portion 80-1 are in contact in the up-down direction, but are not secured to each other with an adhesive.

SECOND EMBODIMENT EXAMPLE

In the second embodiment example, a configuration that is the same as the portion of the power semiconductor module 100 of the first embodiment example including the reinforcing portion 171-1 and the fastening portion 80-1 is used, and the reinforcing portion 171-1 and fastening portion 80-1 were secured to each other with an adhesive. The adhesive used was a silicon-based adhesive.

COMPARATIVE EXAMPLE

Figure 7:
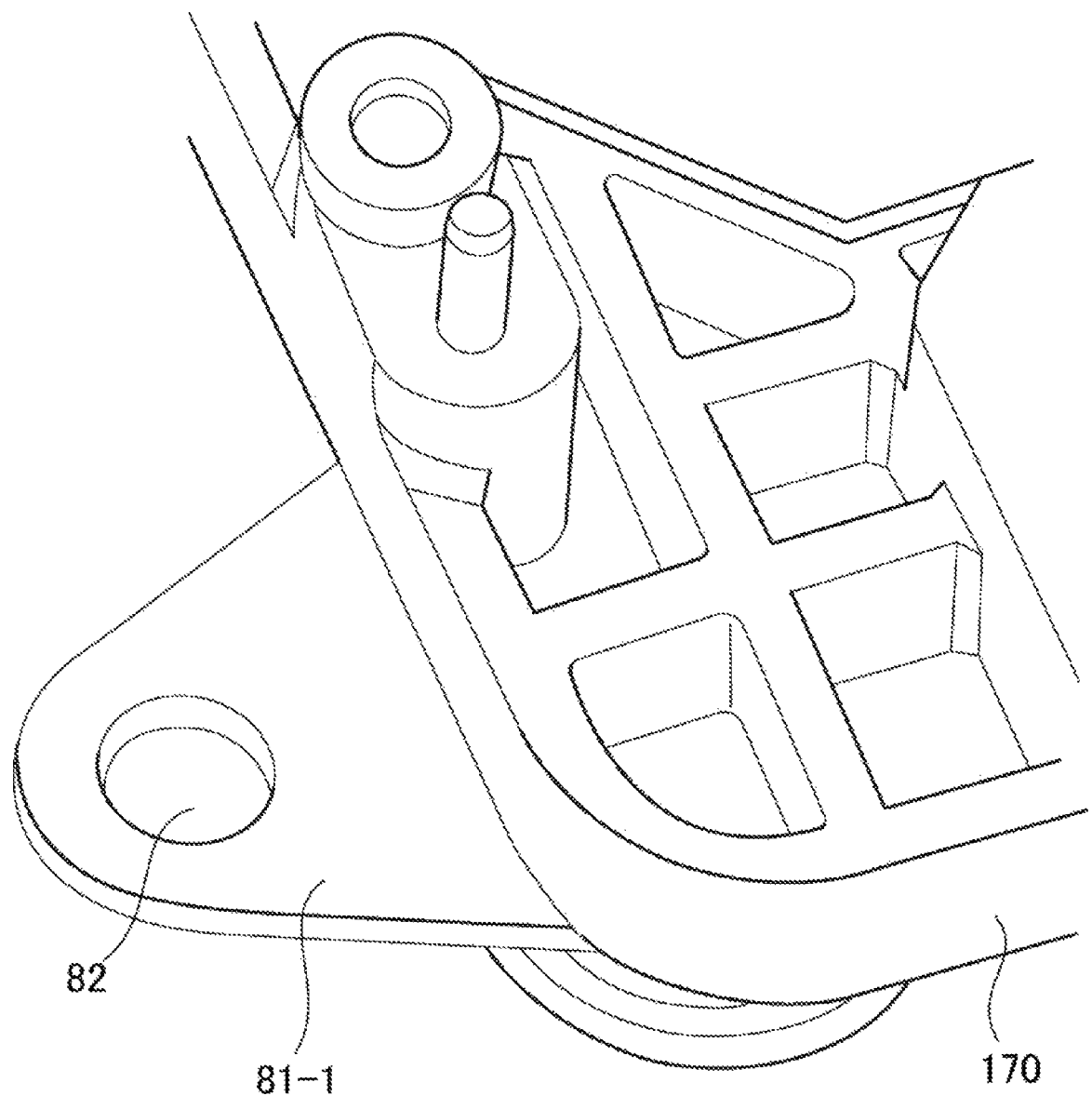
FIG. 7 is a partial enlarged perspective view of a comparative example.

As shown in FIG. 7, the power semiconductor module 100 shown in FIGS. 1 to 6 is used as a comparative example without being provided with the reinforcing portions 171-1. In other words, in the comparative example, the top surfaces of the fastening portions 80-1 of the ceiling plate 20 are exposed.

A thermal stress simulation was performed using the first and second embodiment examples and the comparative example. Specifically, the thermal stress simulation was used to calculate the stress amplitude in the portion where the largest stress is generated by the cooler at $\Delta T=100°$ C., in a TcP/C evaluation where it was assumed that a large load is applied simultaneously during all phases. Furthermore, it was assumed that the material used was A3003. In this way, the results shown below were obtained.

First Embodiment Example: 4.5 N/mm$^2$
Second Embodiment Example: 3.7 N/mm$^2$
Comparative Example: 5.8 N/mm$^2$ Upon further predicting the lifetimes, results were obtained indicating that the second embodiment example can realize a lifetime that is approximately 4 times that of the comparative example.

Figure 8:
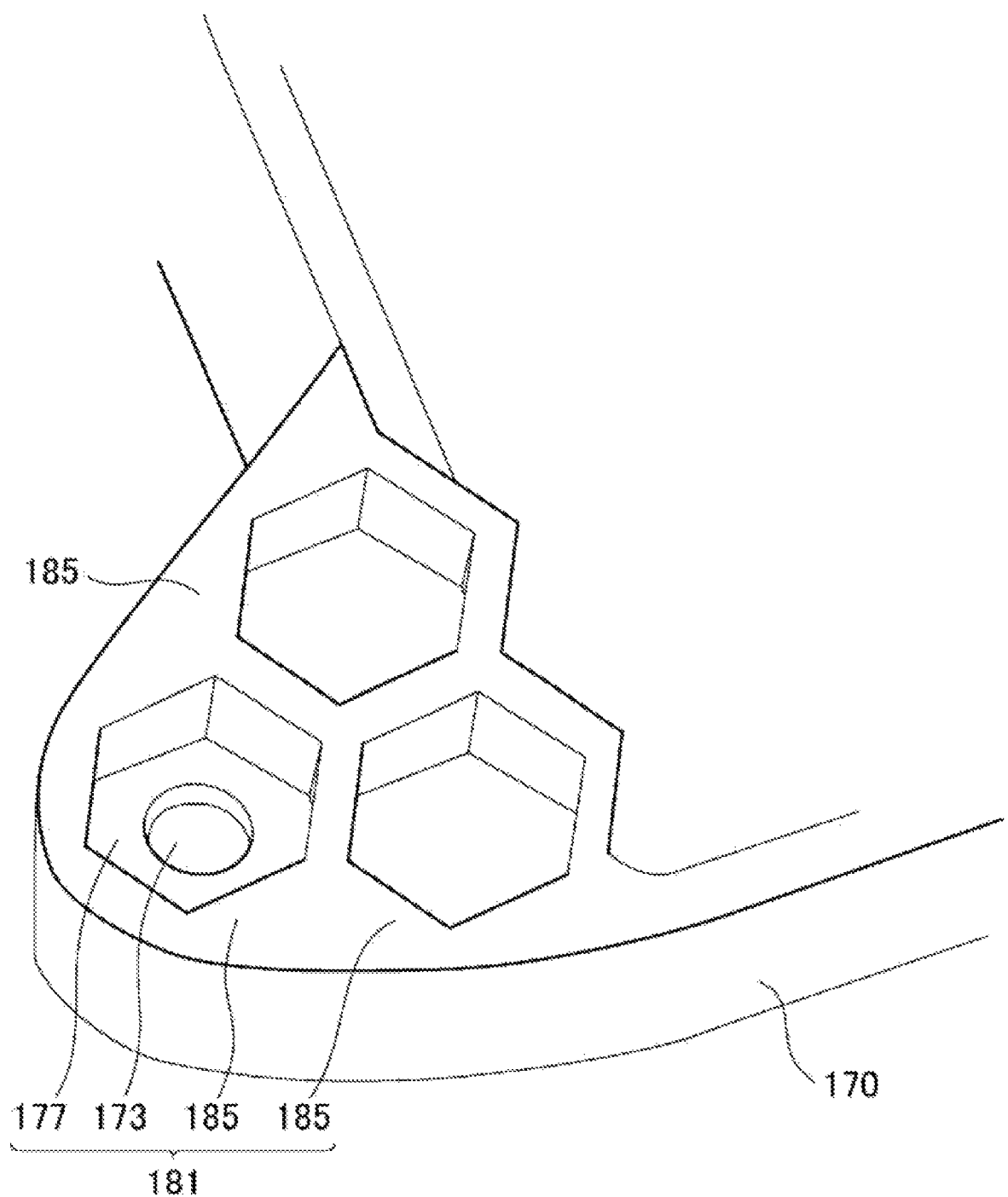
FIG. 8 is a partial enlarged perspective view of an example of another reinforcing portion 181.

FIG. 8 is a partial enlarged perspective view of an example of another reinforcing portion 181. The reinforcing portion 181 of the present example has a so-called honeycomb structure in which three hexagonal pillar portions 185 are joined together. A through-hole 173 is provided in the flat surface portion 177 of the hexagonal pillar portion 185 that extends farthest outward. The other two hexagonal pillar portions 185 may have floor surfaces, but do not need to have floor surfaces.

In the same manner as the reinforcing portion 171-1, the reinforcing portion 181 contacts the top surface of the fastening portion 81-1 of the ceiling plate 20 to cover this entire top surface. The reinforcing portion 181 may be secured to the fastening portion 81-1 by an adhesive. In other words, the reinforcing portion 181 does not have a shape similar to the fastening portion 81-1 in the overhead view.

Furthermore, the present embodiment is not limited to the examples shown in FIGS. 6 and 8, and the reinforcing portion may be formed by other circular pillars or polygonal pillars such as square pillars, or a combination of these pillars. Each pillar-shaped body in the reinforcing portion may be hollow or solid, and may or may not have a floor surface if the reinforcing portion is hollow. The pillar-shaped bodies are arranged such that the side surfaces thereof are parallel to the z-axis.

The reinforcing portion 171-1 of FIG. 6 and the reinforcing portion 181 of FIG. 8 each contact the top surface of the fastening portion 81-1 of the ceiling plate 20 to cover this entire top surface. Furthermore, as shown in FIG. 1, the side surface portion 172 is arranged extending downward outside of the reinforcing portion 171-1 or the like, and this side surface portion 172 covers the entire side surface of the fastening portion 81-1. Instead, the side surface portion 172 may cover only a portion of the side surface of the fastening portion 81-1. Furthermore, the side surface portion 172 may cover all or a portion of the side surface of the cooling apparatus 10. More specifically, the side surface portion 172 may cover all or a portion of the side end surface of the frame 62 and the side end surface of the ceiling plate 20. In this way, it is possible to increase the electrical insulation between the busbar, cooling apparatus 10, and terminals of a capacitor arranged on the bottom surface of the cooling apparatus 10, which are connected during use of the power semiconductor module. It should be noted that the side surface portion 172 does not need to be provided.

Instead of having the reinforcing portion 171-1 or the like cover the entire top surface of the fastening portion 81-1, the reinforcing portion 171-1 or the like may cover a portion of this top surface. In other words, a portion of the fastening portion 81-1 may be exposed in the overhead view. In this case, the reinforcing portion 171-1 or the like preferably extends to cover at least the perimeter of the through-hole 82 in the overhead view.

Each connecting portion 180 connecting a reinforcing portion 171 to the case body 170 is provided at substantially a right angle in the cross-sectional view of FIG. 1, but the connection state is not limited to this. For example, the connecting portion 180 may have a smoothly curved surface. Specifically, the reinforcing portion 171 may be connected to the case body 170 by a smoothly curved surface with a height that becomes progressively lower from the case body 170. Alternatively, the reinforcing portion 171 may be connected to the case body 170 by a smoothly curved surface with a width that becomes progressively narrower from the case body 170. By connecting the reinforcing portion 171 and the case body 170 using a smoothly curved surface, it is possible to prevent stress from being focused on the connecting portion 180.

The ceiling plate 20 and the case 40 may have the same thickness at the fastening portions 80. The ceiling plate 20 and the case 40 may have the same thickness at regions other than the fastening portions 80.

In the case 40, the frame 62 and the sidewall 63 may be provided integrally. The frame 62 and the sidewall 63 may be formed by forging a single piece of plate-shaped metal. Furthermore, the floor plate 64 and the sidewall 63 may be provided integrally, or the floor plate 64 may be brazed to the sidewall 63. The floor plate 64, the frame 62, and the sidewall 63 may have the same thickness. As an example, the thickness of the floor plate 64 at a position opposite the center of the bottom surface 24 of the ceiling plate 20 may be the same as the thickness of the frame 62 at each fastening portion 80. Due to each component having the same thickness, it is possible to manufacture the cooling apparatus 10 using common metal roll material.

Figure 9:
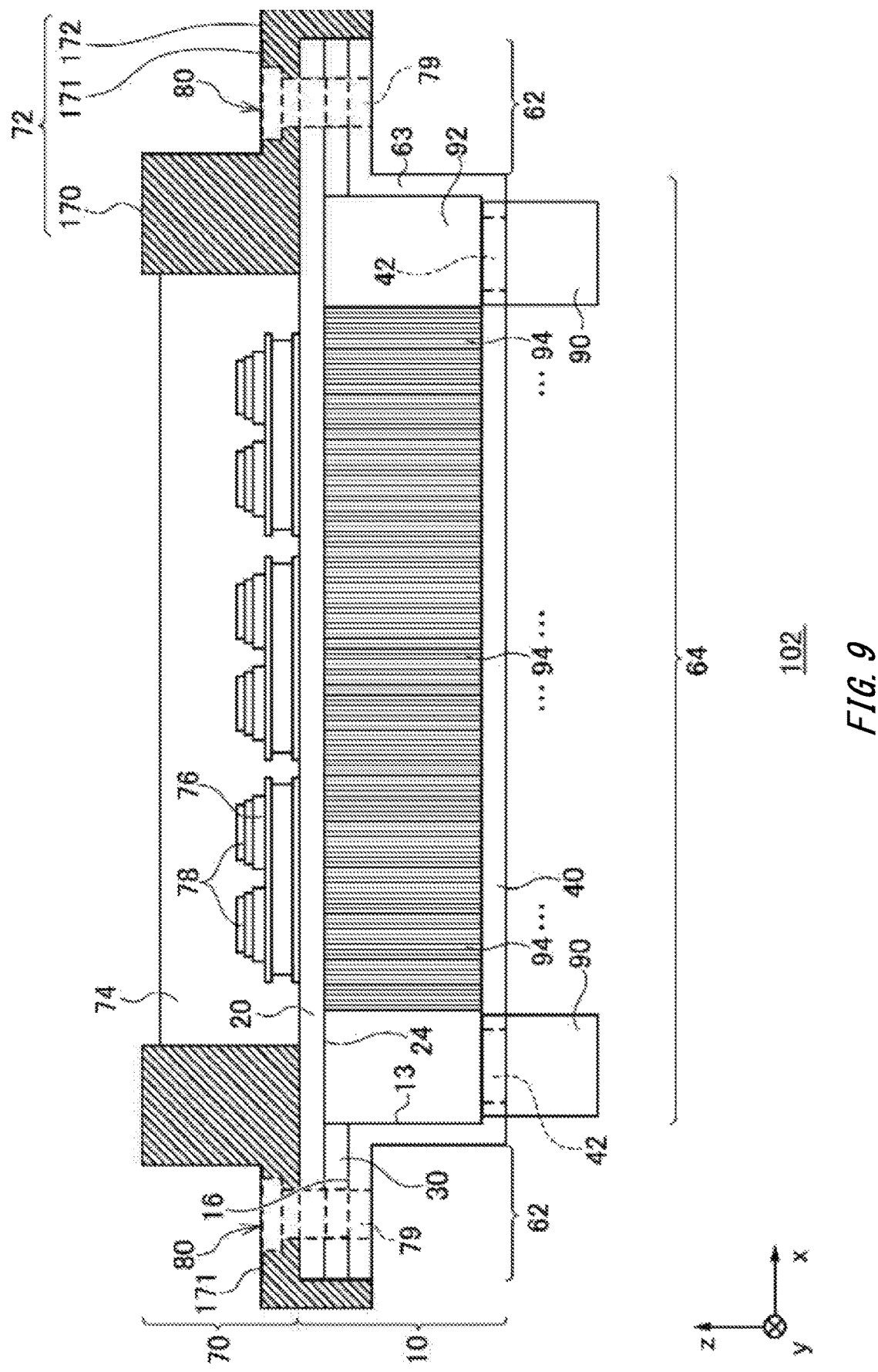
FIG. 9 is a schematic cross-sectional view showing an example of another power semiconductor module 102.

FIG. 9 is a schematic cross-sectional view showing an example of another power semiconductor module 102. In FIG. 9, configurations that are the same as in FIGS. 1 to 8 are given the same reference numerals, and descriptions thereof are omitted. The power semiconductor module 102 differs from the power semiconductor module 100 of FIG. 1 by having a reinforcing member 30 provided between the top surface 16 of the frame 62 of the case 40 and the bottom surface 24 of the ceiling plate 20.

The reinforcing member 30 is arranged between the case 40 and the ceiling plate 20 at a fastening portion 80. The ceiling plate 20 and the reinforcing member 30 are arranged in firm contact with each other, as are the reinforcing member 30 and the case 40. In the present example, brazing is performed between these components. The through-holes 79 are provided penetrating through the reinforcing member 30 as well.

The reinforcing member 30 may be provided from each region where a through-hole 79 is provided to a position opposite the sidewall 63 of the case 40, in the xy-plane. In this way, it is possible to prevent the frame 62 from deforming at the positions opposite the sidewall 63, and to prevent stress from being focused on the connecting portion between the sidewall 63 and the frame 62. Therefore, it is possible to protect the sidewall 63. The sidewall 63 and the inner surface 13 of the reinforcing member 30 may be arranged flush with each other.

Figure 10:
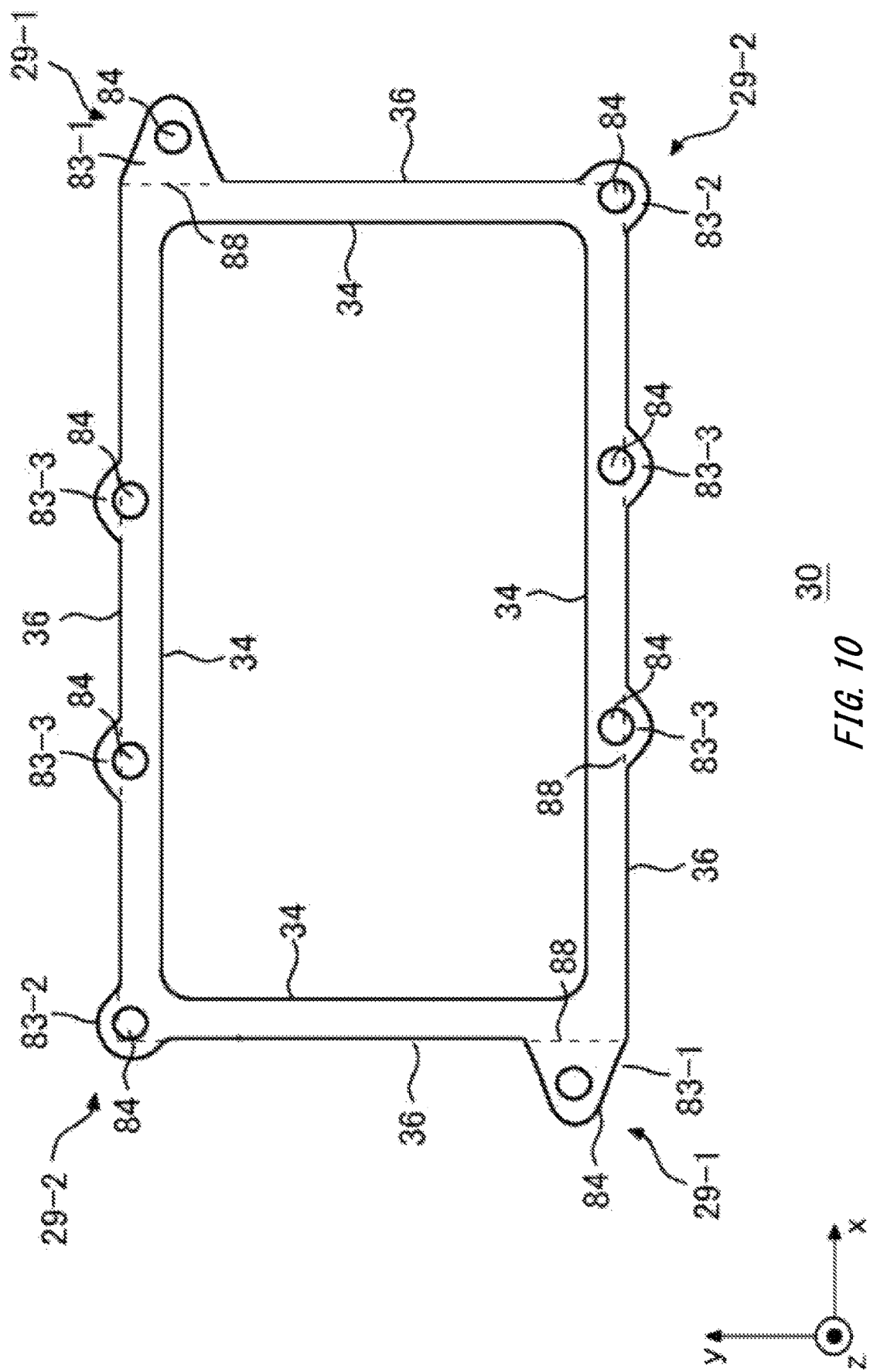
FIG. 10 shows an example of the shape of the reinforcing member 30 in the overhead view (xy-plane).

FIG. 10 shows an example of the shape of the reinforcing member 30 in the overhead view (xy-plane). The reinforcing member 30 of the present example is provided surrounding the cavity 92 shown in FIG. 9. The outer shape of the reinforcing member 30 of the present example in the xy-plane is the same as the outer shape of the ceiling plate 20. In FIG. 10, the periphery 88 of the ceiling plate 20 is shown overlapping the shape of the reinforcing member 30.

The reinforcing member 30 may have the same shape as the frame 62 of the case 40 in the xy-plane. The reinforcing member 30 is arranged between the top surface 16 of the frame 62 and the bottom surface 24 of the ceiling plate 20. The reinforcing member 30 includes an inner surface 34 on the cavity 92 side and an outer surface 36 on the side opposite the inner surface 34 side. The inner surface 34 of the reinforcing member 30 may be arranged flush with the inner surface 13 of the frame 62 of the case 40. The outer surface 36 of the reinforcing member 30 may be arranged flush with the outer surface 11 of the frame 62 of the case 40.

In the same manner as the ceiling plate 20, the reinforcing member 30 also includes corner portions 29 in the xy-plane. Each corner portion 29 of the reinforcing member 30 is provided with a fastening portion 83, in the same manner as the ceiling plate 20. Furthermore, some of the edges of the reinforcing member 30 may be provided with fastening portions 83. In the present example, the shape of each fastening portion 83 in the xy-plane is the same as the shape of the opposing fastening portion 81. Each fastening portion 83 is provided with a through-hole 84. The through-holes 84 are provided at positions overlapping with the through-holes 82 shown in FIG. 2A.

By providing the reinforcing member 30 in addition to the reinforcing portions 171, it is possible to further improve the strength of the fastening portions 80. The reinforcing member 30 may be formed of a material with higher endurance than the ceiling plate 20 and the case 40. Examples of such a material include an aluminum alloy with an endurance greater than or equal to 50 MPa, preferably an aluminum alloy with an endurance from 50 MPa to 65 MPa. In this way, it is possible to further improve the strength of the fastening portions 80.

Figure 11:
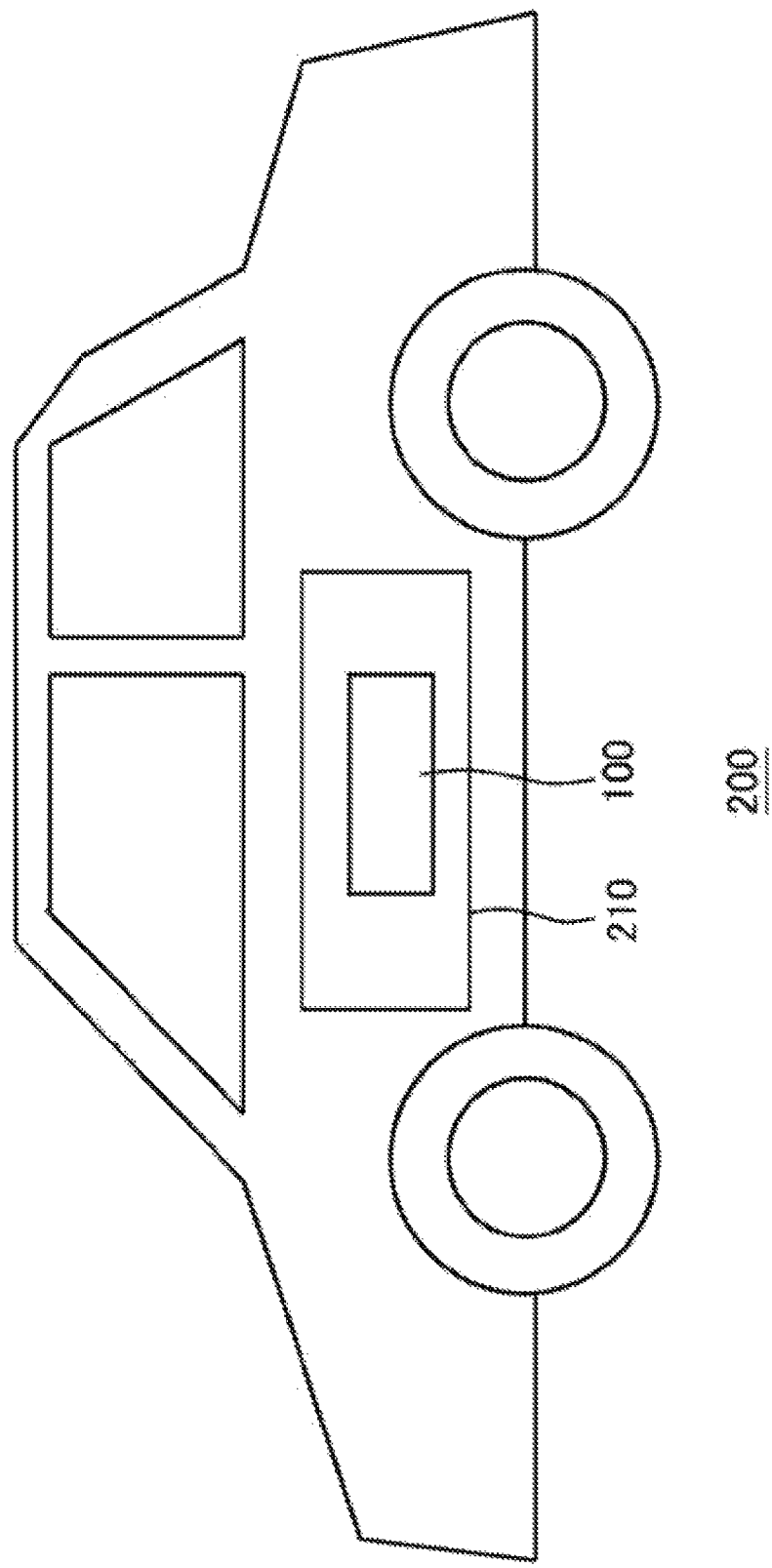
FIG. 11 shows the basics of a vehicle 200 according to an embodiment of the present invention.

FIG. 11 shows the basics of a vehicle 200 according to an embodiment of the present invention. The vehicle 200 is a vehicle that generates at least some of its impetus using electric power. As an example, the vehicle 200 is an electric automobile that generates all of its impetus with an electrical power drive device such as a motor, or a hybrid vehicle that employs both an electrical power drive device such as a motor and an internal combustion engine that performs driving using fuel such as gasoline.

The vehicle 200 includes a control apparatus 210 (external apparatus) that controls the electrical power driving device such as the motor. The control apparatus 210 is provided with the power semiconductor module 100. The power semiconductor module 100 may control the power supplied to the electrical power driving device. The power semiconductor module 100 may be secured to the control apparatus 210 by fastening members inserted into the fastening portions 80 and the like. The cooling apparatus 10 of the power semiconductor module 100 may supply coolant from a cooling system of the control apparatus 210, which is connected to the openings 42 via the pipes 90. The power semiconductor module 102 may be used instead of the power semiconductor module 100.

Figure 12:
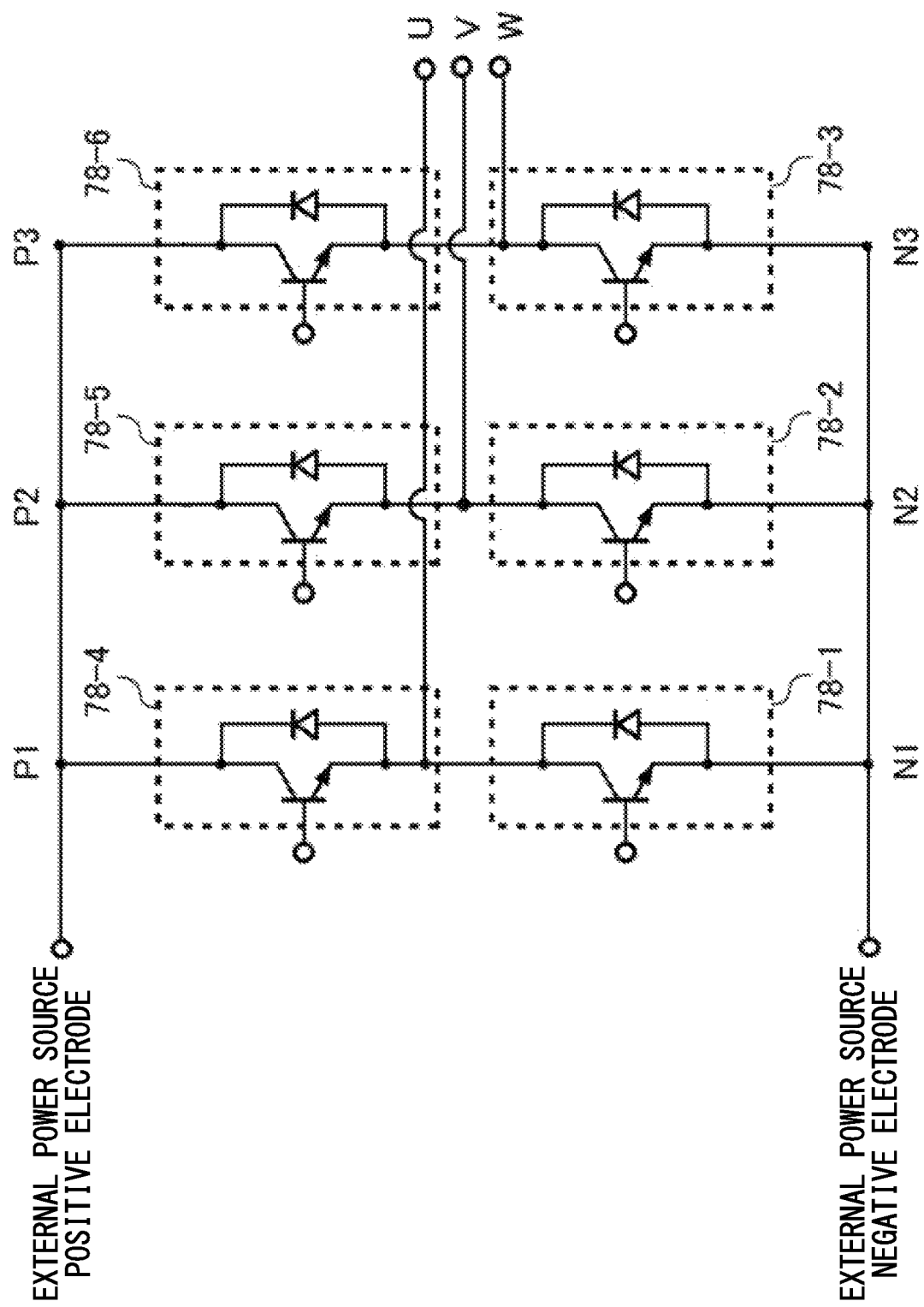
FIG. 12 is a main circuit diagram of the power semiconductor module 100 according to an embodiment of the present invention.

FIG. 12 is a main circuit diagram of the power semiconductor module 100 according to an embodiment of the present invention. The power semiconductor module 100 may be a portion of an on-board unit that drives the motor of the vehicle. The power semiconductor module 100 may function as a three-phase AC inverter circuit that includes output terminals U, V, and W.

Semiconductor chips 78-1, 78-2, and 78-3 may from a lower arm of the power semiconductor module 100, and semiconductor chips 78-4, 78-5, and 78-6 may form an upper arm of the power semiconductor module 100. The set of semiconductor chips 78-1 and 78-4 may form a leg. The set of semiconductor chips 78-2 and 78-5 and the set of semiconductor chips 78-3 and 78-6 may also each form a leg in the same manner. In the semiconductor chip 78-1, the emitter electrode may be electrically connected to an input terminal N1 and the collector electrode may be electrically connected to the output terminal U. In the semiconductor chip 78-4, the emitter electrode may be electrically connected to the output terminal U, and the collector electrode may be electrically connected to an input terminal P1. Similarly, in the semiconductor chips 78-2 and 78-3, the emitter electrodes may be respectively electrically connected to input terminals N2 and N3, and the collector electrodes may be respectively electrically connected to the output terminals V and W. Furthermore, in the semiconductor chips 78-5 and 78-6, the emitter electrodes may be respectively electrically connected to the output terminals V and W, and the collector electrodes may be respectively electrically connected to input terminals P2 and P3.

Each semiconductor chip 78-1 to 78-6 may switch in an alternating manner according to a signal input to a control electrode pad of the semiconductor chip 78. In the present example, each semiconductor chip 78 may generate heat when switching. The input terminals P1, P2, and P3 may be connected to a positive electrode of an external power source, the input terminals N1, N2, and N3 may be connected to a negative terminal of the external power source, and the output terminals U, V, and W may be connected to a load. The input terminals P1, P2, and P3 may be electrically connected to each other, and the other input terminals N1, N2, and N3 may also be electrically connected to each other.

In the power semiconductor module 100, the plurality of semiconductor chips 78-1 to 78-6 may each be an RC-IGBT (reverse conducting IGBT) semiconductor chip. In an RC-IGBT semiconductor chip, an IGBT and a freewheeling diode (FWD) are formed integrally, and the IGBT and FWD may be connected in antiparallel. The plurality of semiconductor chips 78-1 to 78-6 may each include a combination of a transistor such as a MOSFET or IGBT and a diode. The chip substrate of the transistor and diode may be a silicon substrate, a silicon carbide substrate, or a gallium nitride substrate. The main circuit of the power semiconductor module 102 may be the same as the main circuit of the power semiconductor module 100.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A power semiconductor module, comprising:
    a cooling apparatus, and
    a power semiconductor device mounted on the cooling apparatus, wherein the cooling apparatus includes:
        a ceiling plate that has a bottom surface;
        a case that has a coolant flow-through portion and an outer edge portion surrounding the coolant flow-through portion, with the coolant flow-through portion being arranged on the bottom surface of the ceiling plate, the case being arranged in firm contact, either directly or indirectly, with the bottom surface of the ceiling plate at the outer edge portion; and
        a cooling fin that is arranged in the coolant flow-through portion, wherein the ceiling plate and the case respectively include fastening portions that are configured to fasten the ceiling plate and the case to an external apparatus, while the ceiling plate and the outer edge portion are arranged in an overlapping manner,
    the power semiconductor device includes a circuit substrate and a terminal case,
    the fastening portions of the ceiling plate each protrude farther outward than adjacent portions of a periphery of the ceiling plate,
    the terminal case includes a case body and reinforcing portions, wherein the case body is arranged along a perimeter of the circuit substrate, and
    the reinforcing portions extend to top surface sides of the fastening portions of the ceiling plate, and the reinforcing portions include a side surface portion that covers a side surface of a respective one of the fastening portions of the ceiling plate and the case.

2. The power semiconductor module according to claim 1, wherein
the ceiling plate has two sets of opposing edges, in an overhead view, and four corner portions,
the fastening portions of the ceiling plate, at least at two of the four corner portions, are provided protruding farther outward than the periphery of the ceiling plate,
the case is provided with an inlet and an outlet that connect the coolant flow-through portion to the outside, and
the inlet and the outlet are arranged in the case opposite the at least two of the four corner portions provided with the fastening portions of the ceiling plate.

3. The power semiconductor module according to claim 1, wherein a height of each of the reinforcing portions of the ceiling plate is less than or equal to a height of the case body.

4. The power semiconductor module according to claim 1, wherein the reinforcing portions and the fastening portions of the ceiling plate are secured together by an adhesive.

5. The power semiconductor module according to claim 1, wherein
the reinforcing portions protrude farther outward than a periphery of the case body.

6. The power semiconductor module according to claim 1, wherein
the reinforcing portions include a flat surface portion arranged along a perimeter of a through-hole penetrating therethrough in an up-down direction and a cylinder that surrounds the flat surface portion and wherein a portion of the cylinder is thicker than the flat surface portion in the up-down direction.

7. The power semiconductor module according to claim 1, wherein
the reinforcing portions are connected to the case body by a smoothly curved surface with a height that becomes progressively lower from the case body.

8. The power semiconductor module according to claim 1, wherein
the reinforcing portions are connected to the case body by a smoothly curved surface with a width that becomes progressively narrower from the case body.

9. The power semiconductor module according to claim 1, wherein a thickness of the case at a position opposite a center of the bottom surface of the ceiling plate is the same as a thickness of the case at the fastening portions of the ceiling plate.

10. The power semiconductor module according to claim 1, wherein
at the fastening portions of the ceiling plate and the case, the ceiling plate and the case have the a same thickness.

11. The power semiconductor module according to claim 1, further comprising a reinforcing member provided between the ceiling plate and the outer edge portion, at the fastening portions of the ceiling plate and the case.

12. A vehicle, comprising:
a power semiconductor module; and
a control apparatus in which the power semiconductor module is provided, wherein said power semiconductor module comprising:
a cooling apparatus; and
a power semiconductor device mounted on the cooling apparatus, wherein the cooling apparatus includes:
a ceiling plate that has a bottom surface;
a case that has a coolant flow-through portion and an outer edge portion surrounding the coolant flow-through portion, with the coolant flow-through portion being arranged on the bottom surface of the ceiling plate, the case being arranged in firm contact, either directly or indirectly, with the bottom surface of the ceiling plate at the outer edge portion; and
a cooling fin that is arranged in the coolant flow-through portion, wherein the ceiling plate and the case respectively include fastening portions that are configured to fasten the ceiling plate and the case to an external apparatus, while the ceiling plate and the outer edge portion are arranged in an overlapping manner,
the power semiconductor device includes a circuit substrate and a terminal case,
the fastening portions of the ceiling plate each protrude farther outward than adjacent portions of a periphery of the ceiling plate,
the terminal case includes a case body and reinforcing portions, wherein the case body is arranged along a perimeter of the circuit substrate, and
the reinforcing portions extend to top surface sides of the fastening portions of the ceiling plate, and
the reinforcing portions include a side surface portion that covers a side surface of a respective one of the fastening portions of the ceiling plate and the case.

13. A power semiconductor module, comprising:
a cooling apparatus; and
a power semiconductor device mounted on the cooling apparatus, wherein the cooling apparatus includes:
a ceiling plate that has a bottom surface;
a case that has a coolant flow-through portion and an outer edge portion surrounding the coolant flow-through portion, with the coolant flow-through portion being arranged on the bottom surface of the ceiling plate, the case being arranged in firm contact, either directly or indirectly, with the bottom surface of the ceiling plate at the outer edge portion; and
a cooling fin that is arranged in the coolant flow-through portion, wherein the ceiling plate and the case respectively include fastening portions that are configured to fasten the ceiling plate and the case to an external apparatus, while the ceiling plate and the outer edge portion are arranged in an overlapping manner,
the power semiconductor device includes a circuit substrate and a terminal case,
the terminal case includes a case body and reinforcing portions, wherein the case body is arranged along a perimeter of the circuit substrate, and the reinforcing portions extend to top surface sides of the fastening portions of the ceiling plate,
the reinforcing portions include a side surface portion that covers a side surface of a respective one of the fastening portions of the ceiling plate and the case, and
the fastening portions of the ceiling plate each include:
first portions that protrude in two opposite first corners from adjacent sides of orthogonal edges of the ceiling plate of the cooling apparatus; and
second portions that protrude farther in two opposite second corners different than the first corners.

14. A power semiconductor module, comprising:
a cooling apparatus; and
a power semiconductor device mounted on the cooling apparatus, wherein the cooling apparatus includes:

a ceiling plate that has a bottom surface;

a case that has a coolant flow-through portion and an outer edge portion surrounding the coolant flow-through portion, with the coolant flow-through portion being arranged on the bottom surface of the ceiling plate, the case being arranged in firm contact, either directly or indirectly, with the bottom surface of the ceiling plate at the outer edge portion;

a cooling fin that is arranged in the coolant flow-through portion; and an inlet and an outlet that are configured to connect the coolant flow-through portion to outside, the inlet and the outlet penetrating the bottom surface in an up-down direction, wherein the ceiling plate and the case respectively include fastening portions that are configured to fasten the ceiling plate and the case to an external apparatus, while the ceiling plate and the outer edge portion are arranged in an overlapping manner, the power semiconductor device includes a circuit substrate and a terminal case, the fastening portions of the ceiling plate each protrude farther outward than adjacent portions of a periphery of the ceiling plate, the terminal case includes a case body and reinforcing portions, wherein the case body is arranged along a perimeter of the circuit substrate, and the reinforcing portions extend to top surface sides of the fastening portions of the ceiling plate, and the reinforcing portions include a side surface portion that covers a side surface of a respective one of the fastening portions of the ceiling plate and the case.

* * * * *